(12) United States Patent
Iwahori

(10) Patent No.: US 12,142,606 B2
(45) Date of Patent: Nov. 12, 2024

(54) SEMICONDUCTOR INTEGRATED CIRCUIT DEVICE AND METHOD OF MANUFACTURING SEMICONDUCTOR INTEGRATED CIRCUIT DEVICE

(71) Applicant: Socionext Inc., Kanagawa (JP)

(72) Inventor: Junji Iwahori, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 414 days.

(21) Appl. No.: 17/706,117

(22) Filed: Mar. 28, 2022

(65) Prior Publication Data

US 2022/0223588 A1 Jul. 14, 2022

Related U.S. Application Data

(63) Continuation of application No. PCT/JP2020/035675, filed on Sep. 23, 2020.

(30) Foreign Application Priority Data

Oct. 2, 2019 (JP) .................. 2019-182406

(51) Int. Cl.
*H01L 27/088* (2006.01)
*H01L 21/8234* (2006.01)
(Continued)

(52) U.S. Cl.
CPC .... *H01L 27/088* (2013.01); *H01L 21/823412* (2013.01); *H01L 21/823437* (2013.01);
(Continued)

(58) Field of Classification Search
CPC ........... H01L 27/088; H01L 21/823412; H01L 21/823437; H01L 29/0665; H01L 29/42356; H01L 29/42392; H01L 21/823828; H01L 27/0207; H01L 21/823871; H01L 29/0847;
(Continued)

(56) References Cited

U.S. PATENT DOCUMENTS

2014/0001564 A1 1/2014 Song et al.
2014/0124868 A1 5/2014 Kamal et al.
(Continued)

FOREIGN PATENT DOCUMENTS

JP 2014-010839 A 1/2014
JP 2018-026565 A 2/2018
(Continued)

OTHER PUBLICATIONS

International Search Report (ISR) dated Dec. 15, 2020 issued in International Patent Application No. PCT/JP2020/035675, with English translation.

*Primary Examiner* — Mohammed R Alam
(74) *Attorney, Agent, or Firm* — Rimon P.C.

(57) ABSTRACT

A standard cell includes: a gate interconnect; a dummy gate interconnect formed to be adjacent to the gate interconnect on the right side of the gate interconnect in the figure in the X direction; a pad provided between the gate interconnect and the dummy gate interconnect; a nanosheet formed to overlap the gate interconnect as viewed in plan and connected with the pad; and a dummy nanosheet formed to overlap the dummy gate interconnect as viewed in plan and connected with the pad.

6 Claims, 13 Drawing Sheets

(51) Int. Cl.
*H01L 29/06* (2006.01)
*H01L 29/423* (2006.01)

(52) U.S. Cl.
CPC .... *H01L 29/0665* (2013.01); *H01L 29/42356* (2013.01); *H01L 29/42392* (2013.01)

(58) Field of Classification Search
CPC ......... H01L 29/78696; H01L 29/66439; H01L 29/775; H01L 29/0673; H01L 27/092; H01L 27/0924; H01L 21/823807; H01L 21/823821; B82Y 10/00; B82Y 40/00
See application file for complete search history.

(56) References Cited

U.S. PATENT DOCUMENTS

| | | |
|---|---|---|
| 2018/0026042 A1 | 1/2018 | Smith et al. |
| 2019/0123063 A1 | 4/2019 | Hino et al. |
| 2019/0164993 A1 | 5/2019 | Shimbo |
| 2020/0381426 A1* | 12/2020 | Xu ........................ H01L 27/088 |
| 2021/0066291 A1* | 3/2021 | Lin .................. H01L 29/42384 |

FOREIGN PATENT DOCUMENTS

| | | |
|---|---|---|
| JP | 2018-125542 A | 8/2018 |
| WO | 2018/003634 A1 | 1/2018 |
| WO | 2018/025580 A1 | 2/2018 |

\* cited by examiner

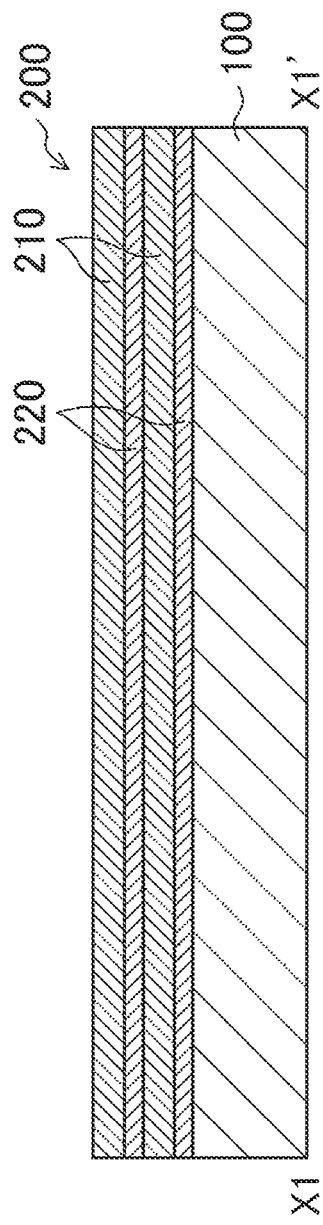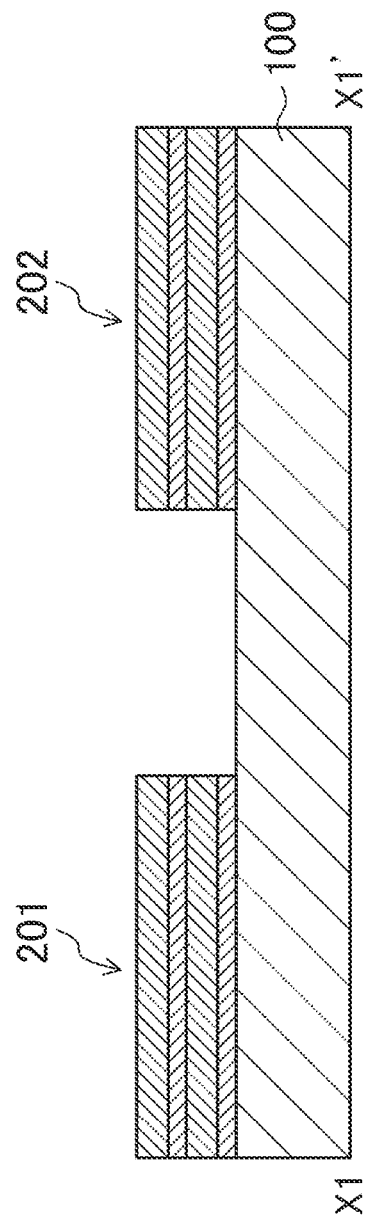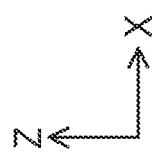

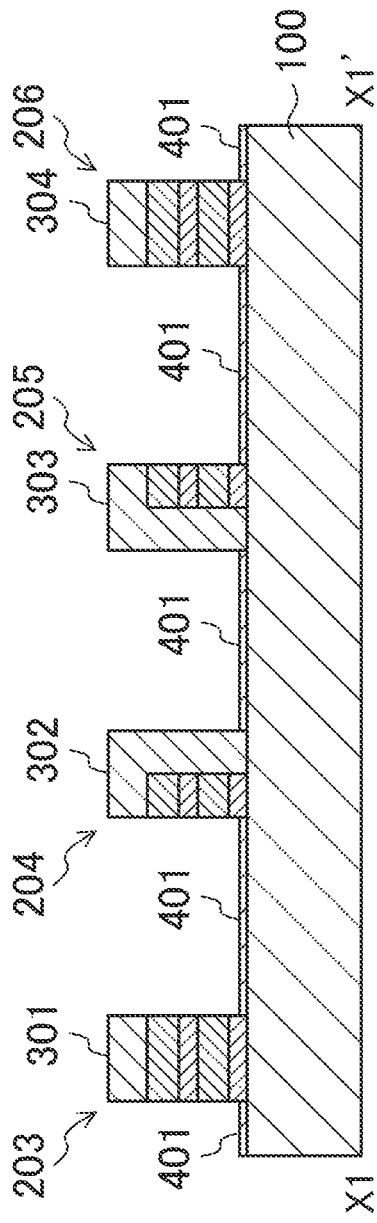
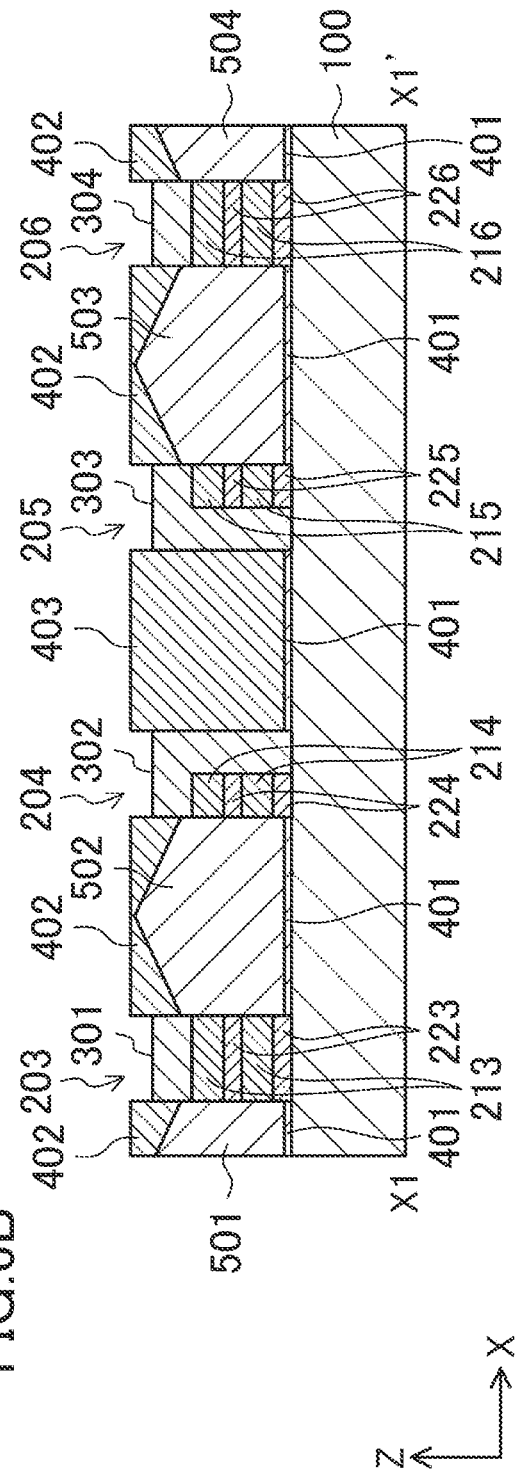

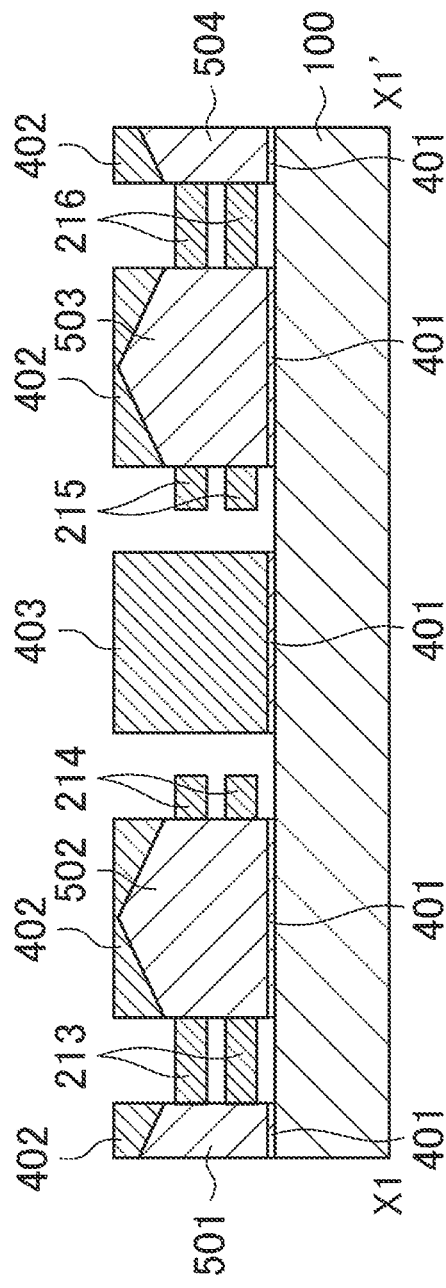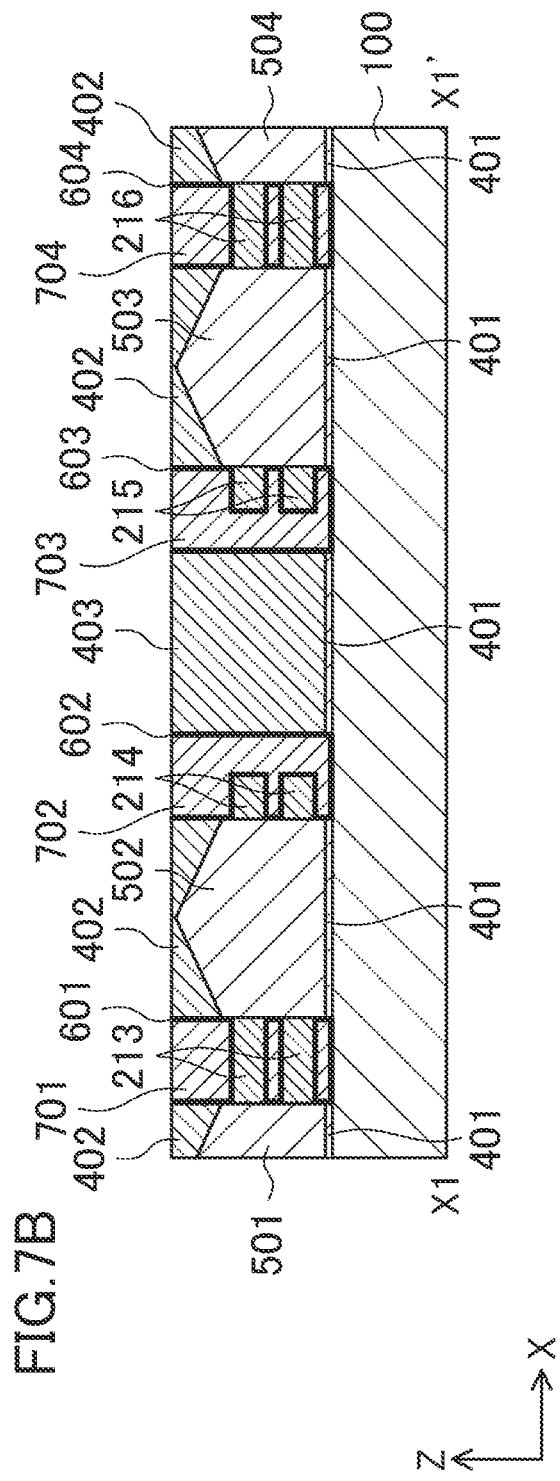

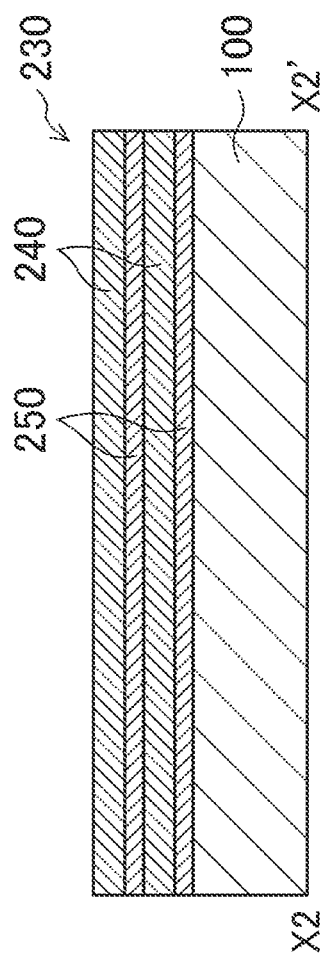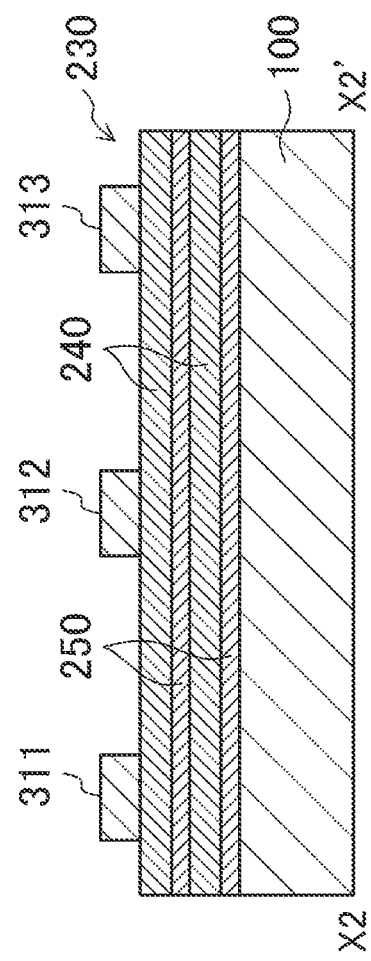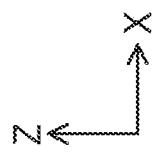

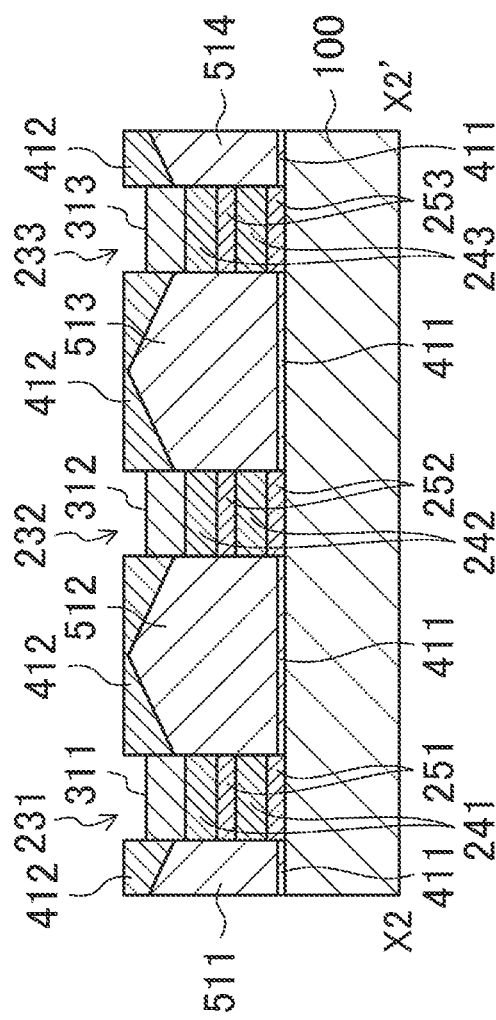
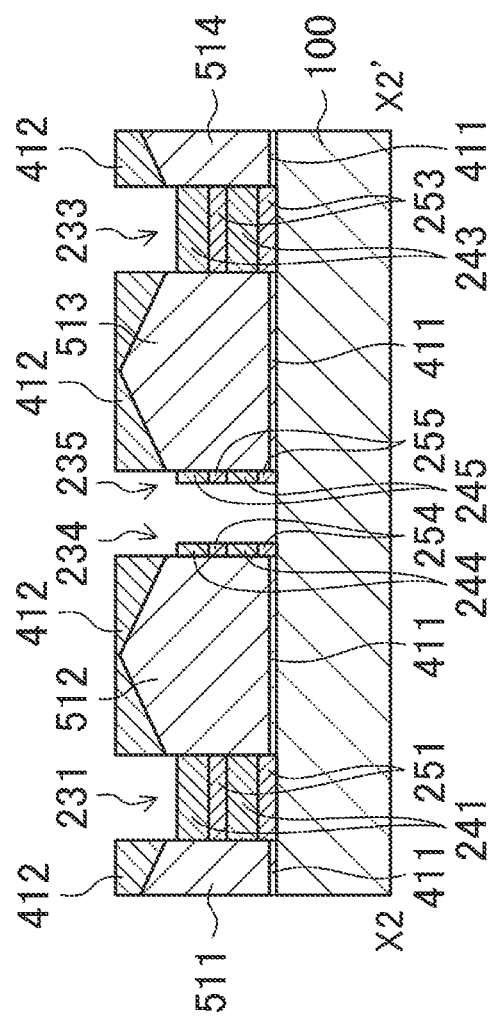
FIG.12A
FIG.12B

SEMICONDUCTOR INTEGRATED CIRCUIT DEVICE AND METHOD OF MANUFACTURING SEMICONDUCTOR INTEGRATED CIRCUIT DEVICE

CROSS-REFERENCE TO RELATED APPLICATIONS

This is a continuation of International Application No. PCT/JP2020/035675 filed on Sep. 23, 2020, which claims priority to Japanese Patent Application No. 2019-182406 filed on Oct. 2, 2019. The entire disclosures of these applications are incorporated by reference herein.

BACKGROUND

The present disclosure relates to a layout structure of a semiconductor integrated circuit device provided with standard cells (hereinafter simply called cells as appropriate) using nanosheet field effect transistors (FETs), and a method of manufacturing such a semiconductor integrated circuit device.

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through interconnects, thereby designing an LSI chip.

As for transistors as basic constituents of an LSI, improvement in integration degree, reduction in operating voltage, and improvement in operating speed have been achieved thanks to scaling down of the gate length. Recently, however, increase in off current due to excessive scaling and the resulting significant increase in power consumption have raised a problem. To solve this problem, three-dimensional transistors having a three-dimensional structure changed from the conventional planar structure have been vigorously studied. As one type of such three-dimensional transistors, a nanosheet FET (nanowire FET) has received attention.

International Patent Publication No. WO2018/025580 discloses a layout structure of a semiconductor integrated circuit device in which dummy pads having no contribution to the logical functions of the circuit are placed in standard cells using nanosheet FETs.

The cited patent document discloses nanosheets forming the channel portions of the nanosheet FETs and pads connected to both ends of the nanosheets to form the source and drain portions of the nanosheet FETs. In the cited patent document, however, no detailed examination has been made on a layout structure, and a manufacturing method thereof, for controlling variations in the performance of transistors formed in the standard cells.

An objective of the present disclosure is providing a layout structure of a semiconductor integrated circuit device provided with standard cells using nanosheet FETs, and a manufacturing method thereof, for controlling variations in the performance of transistors formed in the standard cells.

SUMMARY

According to the first mode of the present disclosure, a semiconductor integrated circuit device provided with first and second standard cells is provided, wherein the first and second standard cells are arranged side by side in a first direction. The first standard cell includes a first gate interconnect, a first dummy gate interconnect formed to be adjacent to the first gate interconnect on a side of the first gate interconnect closer to the second standard cell in the first direction, a first pad provided between the first gate interconnect and the first dummy gate interconnect, a first nanosheet formed to overlap the first gate interconnect as viewed in plan and connected with the first pad, and a first dummy nanosheet formed to overlap the first dummy gate interconnect as viewed in plan and connected with the first pad. The second standard cell includes a second gate interconnect, a second dummy gate interconnect formed to be adjacent to the second gate interconnect on a side of the second gate interconnect closer to the first standard cell in the first direction and also formed to be adjacent to the first dummy gate interconnect, and a second pad provided between the second gate interconnect and the second dummy gate interconnect.

According to the above mode, the first pad is provided between the first gate interconnect and the first dummy gate interconnect formed to be adjacent to the first gate interconnect on the side of the first gate interconnect closer to the second standard cell in the first direction. The first pad is connected with the first nanosheet formed to overlap the first gate interconnect as viewed in plan and with the first dummy nanosheet formed to overlap the first dummy gate interconnect as viewed in plan.

That is, the first pad is formed between the first nanosheet that functions as a channel portion and the first dummy nanosheet that does not function as a channel portion. The first pad is therefore formed by epitaxially growing the multilayer semiconductor units that are to be the first nanosheet and the first dummy nanosheet. This indicates that the first pad is formed in a manner similar to a pad formed between nanosheets functioning as channel portions. Therefore, since variations in the manufacturing precision of transistors and variations in the performance of transistors can be controlled, it is possible to achieve improvement in the reliability and yield of the semiconductor integrated circuit device.

According to the second mode of the present disclosure, a semiconductor integrated circuit device provided with first and second standard cells is provided, wherein the first and second standard cells are placed adjacently in a first direction. A first dummy gate interconnect is formed along a cell boundary between the first and second standard cells. The first standard cell includes a first gate interconnect formed to be adjacent to the first dummy gate interconnect in the first direction, a first pad provided between the first dummy gate interconnect and the first gate interconnect, a first nanosheet formed to overlap the first gate interconnect as viewed in plan and connected with the first pad, and a first dummy nanosheet formed to overlap the first dummy gate interconnect as viewed in plan and connected with the first pad. The second standard cell includes a second gate interconnect formed to be adjacent to the first dummy gate interconnect in the first direction, a second pad provided between the first dummy gate interconnect and the second gate interconnect, a second nanosheet formed to overlap the second gate interconnect as viewed in plan and connected with the second pad, and a second dummy nanosheet formed to overlap the first dummy gate interconnect as viewed in plan, connected with the second pad, and formed to be away from the first dummy nanosheet.

According to the above mode, the first dummy gate interconnect is formed along the cell boundary between the first and second standard cells placed adjacently in the first direction. The first pad is provided between the first dummy gate interconnect and the first gate interconnect formed to be adjacent to the first dummy gate interconnect in the first direction. The first pad is connected with the first nanosheet formed to overlap the first gate interconnect as viewed in plan and with the first dummy nanosheet formed to overlap the first dummy gate interconnect as viewed in plan. Also, the second pad is provided between the first dummy gate interconnect and the second gate interconnect formed to be adjacent to the first dummy gate interconnect in the first direction. The second pad is connected with the second nanosheet formed to overlap the second gate interconnect as viewed in plan and with the second dummy nanosheet formed to overlap the first dummy gate interconnect as viewed in plan and also formed to be away from the first dummy nanosheet.

That is, the first pad is formed between the first nanosheet that functions as a channel portion and the first dummy nanosheet that does not function as a channel portion. The second pad is formed between the second nanosheet that functions as a channel portion and the second dummy nanosheet that is away from the first dummy nanosheet and does not function as a channel portion. Therefore, the first pad is formed by epitaxially growing the multilayer semiconductor units that are to be the first nanosheet and the first dummy nanosheet, and the second pad is formed by epitaxially growing the multilayer semiconductor units that are to be the second nanosheet and the second dummy nanosheet. This indicates that the first and second pads are formed in a manner similar to a pad formed between nanosheets functioning as channel portions. Therefore, since variations in the manufacturing precision of transistors and variations in the performance of transistors can be controlled, it is possible to achieve improvement in the reliability and yield of the semiconductor integrated circuit device.

Also, with the first and second standard cells being placed adjacently in the first direction, it is possible to achieve reduction in the area of the semiconductor integrated circuit device.

According to the third mode of the present disclosure, a method of manufacturing a semiconductor integrated circuit device provided with first and second standard cells is provided, the first and second standard cells being placed adjacently in a first direction. The method includes the steps of: forming a multilayer semiconductor by alternately stacking two kinds of semiconductors different from each other on a semiconductor substrate; forming, on the multilayer semiconductor, a first sacrifice gate structure at a position of a cell boundary between the first and second standard cells, forming a second sacrifice gate structure at a position where the first standard cell is to be formed, and forming a third sacrifice gate structure at a position where the second standard cell is to be formed; forming first to third multilayer semiconductor units under the first to third sacrifice gate structures by removing portions of the multilayer semiconductor located between the first and second sacrifice gate structures and between the first and third sacrifice gate structures; forming a first pad between the first and second multilayer semiconductor units by epitaxially growing the first and second multilayer semiconductor units, and forming a second pad between the first and third multilayer semiconductor units by epitaxially growing the first and third multilayer semiconductor units; removing the first to third sacrifice gate structures; and removing part or all of the first multilayer semiconductor unit so as to avoid electrical connection between the first pad and the second pad through the first multilayer semiconductor unit.

According to the above mode, the first and second multilayer semiconductor units are formed adjacently in the first direction, and the first and third multilayer semiconductor units are formed adjacently in the first direction. The first pad is formed by epitaxially growing the first multilayer semiconductor unit and the second multilayer semiconductor unit. The second pad is formed by epitaxially growing a side face of the first multilayer semiconductor unit and the third multilayer semiconductor unit. Part or all of the first multilayer semiconductor unit is removed so as to avoid electrical connection between the first pad and the second pad.

That is, the first and second pads are each formed by epitaxially growing the multilayer semiconductor units formed adjacently in the first direction. This indicates that the first and second pads are formed in a manner similar to a pad formed between nanosheets functioning as channel portions. Therefore, since variations in the manufacturing precision of transistors and variations in the performance of transistors can be controlled, it is possible to achieve improvement in the reliability and yield of the semiconductor integrated circuit device.

According to the present disclosure, a layout structure of standard cells using nanosheet FETs, and a manufacturing method thereof, for controlling variations in the performance of transistors formed in the standard cells can be implemented.

BRIEF DESCRIPTION OF THE DRAWINGS

FIGS. 4A-4B are views for explaining a method of manufacturing the semiconductor integrated circuit device according to the first embodiment.

FIGS. 6A-6B are views for explaining the method of manufacturing the semiconductor integrated circuit device according to the first embodiment.

FIGS. 7A-7B are views for explaining the method of manufacturing the semiconductor integrated circuit device according to the first embodiment.

FIGS. 10A-10B are views for explaining a method of manufacturing the semiconductor integrated circuit device according to the second embodiment.

FIGS. 12A-12B are views for explaining the method of manufacturing the semiconductor integrated circuit device according to the second embodiment.

DETAILED DESCRIPTION

Figure 1:
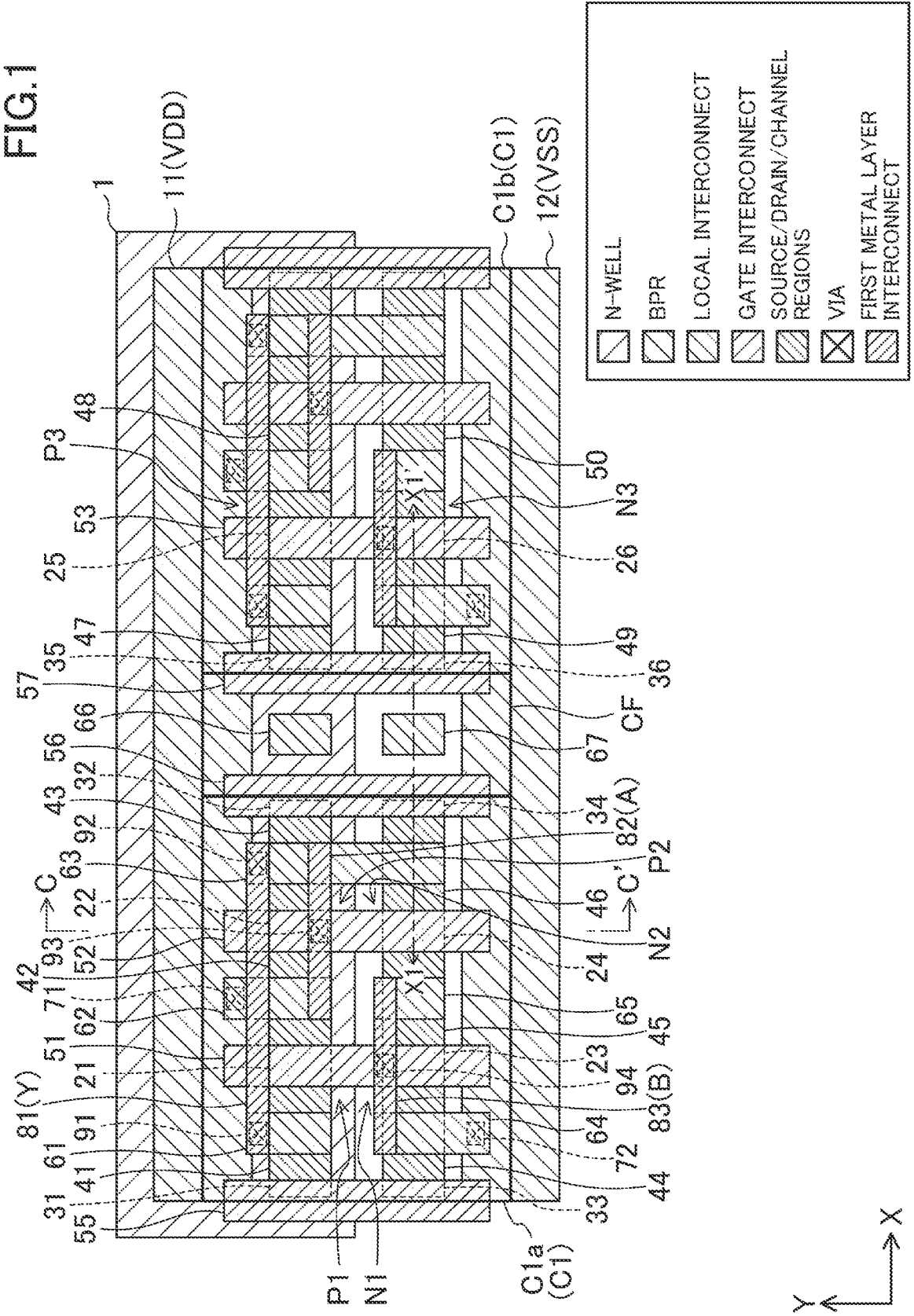
FIG. 1 is a plan view showing an example of the layout structure of a semiconductor integrated circuit device according to the first embodiment.

Embodiments of the present disclosure will be described hereinafter with reference to the accompanying drawings. In the following embodiments, a semiconductor integrated circuit device includes a plurality of standard cells (herein simply called cells as appropriate) and at least some of the plurality of standard cells include a nanosheet field effect transistor (FET).

Also, a semiconductor layer portion formed on each end of a nanosheet to constitute a terminal that is to be the source or drain of a transistor is herein called a "pad."

Note that, in the plan views and the cross-sectional views in the following embodiments, illustration of various insulating films may be omitted in some cases. Note also that nanosheets and pads on both ends of the nanosheets may be illustrated in simplified linear shapes in some cases. Also, as used herein, an expression indicating that sizes, etc. are identical, such as the "same size," is to be understood as including a range of manufacturing variations.

The source and drain of a transistor is herein called the "nodes" of the transistor as appropriate. That is, one node of a transistor refers to the source or drain of the transistor, and both nodes of a transistor refer to the source and drain of the transistor.

In the following embodiments, "VDD" and "VSS" are used for indicating the voltages or the power supplies themselves.

In the following embodiments and alterations, like components are denoted by the same reference characters and description thereof may be omitted.

First Embodiment

Figure 2:
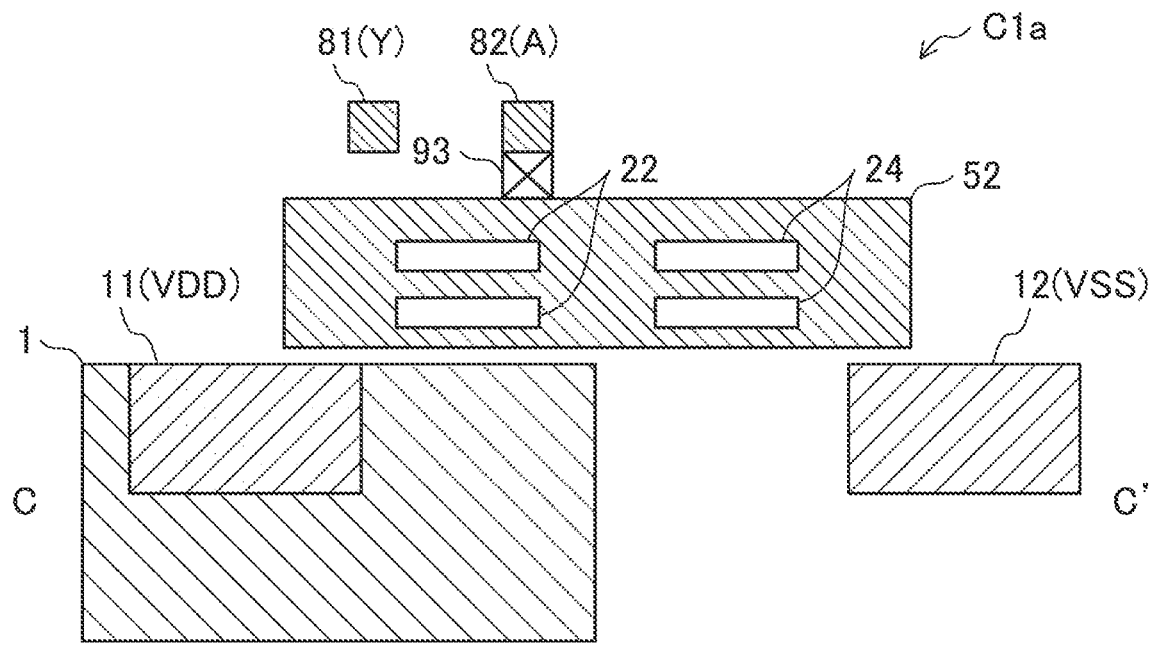
FIG. 2 is a cross-sectional view showing an example of the layout structure of a standard cell according to the first embodiment.

FIGS. 1 and 2 are views showing an example of the layout structure of a semiconductor integrated circuit device according to the first embodiment, where FIG. 1 is a plan view and FIG. 2 is a cross-sectional view taken vertically as viewed in plan. Specifically, FIG. 2 shows a cross section taken along line C-C' in FIG. 1.

Note that, in the following description, in the plan views such as FIG. 1, the horizontal direction is called an X direction, the vertical direction is called a Y direction, and the direction perpendicular to the substrate plane is called a Z direction. The solid lines drawn to surround cells in the plan views such as FIG. 1 define the bounds of the cells (the outer rims of standard cells C1 and a filler cell CF).

In FIG. 1, a plurality of standard cells are arranged side by side in the X direction, constituting a cell row. Specifically, a filler cell CF is placed between standard cells C1. Note that the standard cell C1 on the left in the figure is called a standard cell C1a and the standard cell C1 on the right in the figure a standard cell C1b in some cases.

The standard cells C1 each include nanosheet FETs and have a logical function (2-input NAND). The filler cell CF does not include a nanosheet FET, having no logical function.

In the present disclosure, a cell having a logical function such as a NAND gate and a NOR gate within the cell, like the standard cells C1, is called a "logical cell" as appropriate. Also, a cell having no logical function, which is placed between logical cells without contributing to any logical function of a circuit block, like the filler cell CF, is called a "filler cell" as appropriate.

Also, in the present disclosure, the standard cells C1 each include a nanosheet that functions as a channel portion of a transistor and a nanosheet that does not function as a channel portion of a transistor. The latter nanosheet failing to function as a channel portion is especially called a "dummy nanosheet."

In the present disclosure, the standard cells C1 each include a gate interconnect that forms a transistor and a gate interconnect that does not form a transistor. The latter gate interconnect failing to form a transistor is especially called a "dummy gate interconnect."

As shown in FIGS. 1 and 2, in the standard cells C1 and the filler cell CF, an N-well region 1 is formed to expand in the X and Y directions from the center portion in the Y direction up to the upper end in the figure. In the standard cells C1 and the filler cell CF, also, power supply lines 11 and 12 extending in the X direction are formed along both ends in the Y direction. Both the power supply lines 11 and 12 are buried power rails (BPRs) formed in a buried interconnect layer: the power supply line 11, formed in the N-well region 1, supplies a power supply voltage VDD, and the power supply line 12 supplies a power supply voltage VSS.

Figure 3:
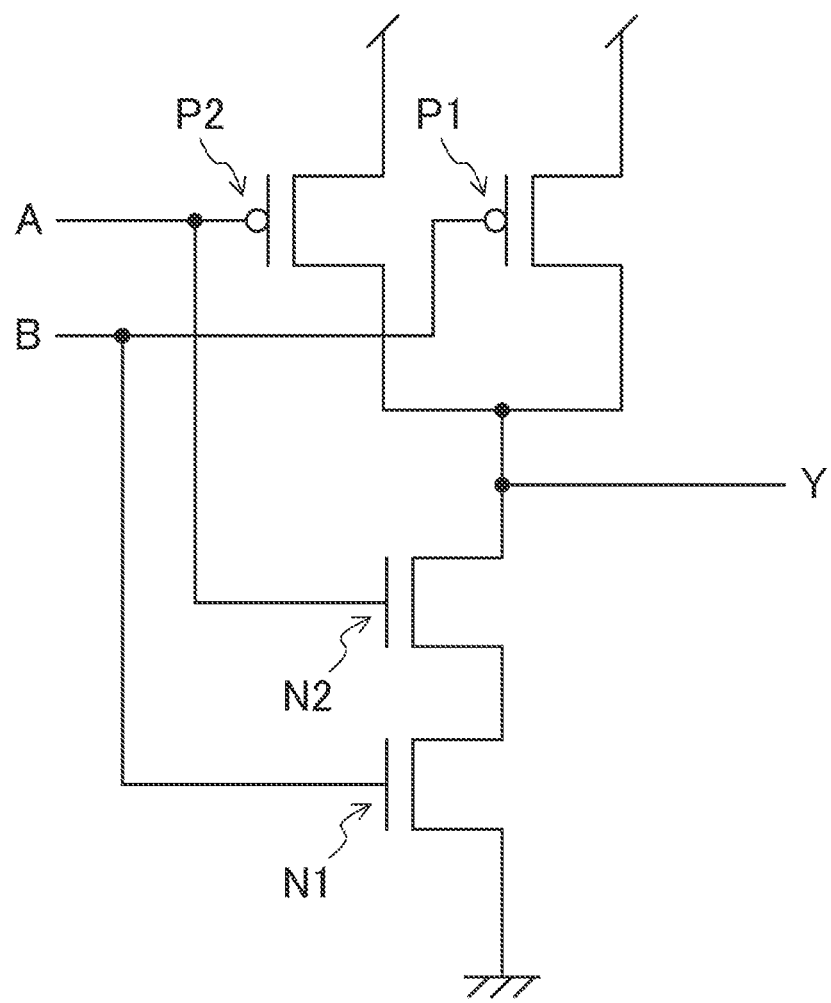
FIG. 3 is a circuit diagram of a standard cell C1 shown in FIG. 1.

FIG. 3 is a circuit diagram of a standard cell C1. As shown in FIG. 3, the standard cell C1 has transistors P1, P2, N1, and N2, constituting a 2-input NAND circuit having inputs A and B and an output Y.

(Configuration of Standard Cell C1)

The configuration of the standard cell C1 will be described taking the standard cell C1a as an example. It is noted that, in FIG. 1, for the standard cell C1b, nanosheets 25 and 26, dummy nanosheets 35 and 36, pads 47 to 50, a gate interconnect 53, a dummy gate interconnect 57, and transistors P3 and N3 respectively correspond to nanosheets 21 and 23, dummy nanosheets 31 and 33, pads 41, 42, 44 and 45, a gate interconnect 51, a dummy gate interconnect 55, and the transistors P1 and N1 of the standard cell C1 (C1a).

In the standard cell C1, sheet-shaped nanosheets 21 to 24 and dummy nanosheets 31 to 34 expanding in the X and Y directions are formed above the power supply lines 11 and 12. The nanosheets 21 and 22 and the dummy nanosheets 31 and 32 are formed to lie side by side in the X direction. The nanosheets 23 and 24 and the dummy nanosheets 33 and 34 are formed to lie side by side in the X direction.

The nanosheets 21 and 23 overlap the gate interconnect 51 as viewed in plan, and the nanosheets 22 and 24 overlap a gate interconnect 52 as viewed in plan. The dummy nanosheets 31 and 33 overlap the dummy gate interconnect 55 as viewed in plan, and the dummy nanosheets 32 and 34 overlap a dummy gate interconnect 56 as viewed in plan.

The dummy nanosheets 31 and 33 each extend from the right end of the dummy gate interconnect 55 up to the center thereof (near the left rim of the standard cell C1) as viewed in the figure. The dummy nanosheets 32 and 34 each extend from the left end of the dummy gate interconnect 56 up to the center thereof (near the right rim of the standard cell C1) as viewed in the figure.

Pads 41 to 43 doped with a p-type semiconductor are formed between the dummy nanosheets 31 and the nanosheets 21, between the nanosheets 21 and 22, and between the nanosheets 22 and the dummy nanosheets 32, respectively. Pads 44 to 46 doped with an n-type semiconductor are formed between the dummy nanosheets 33 and the nanosheets 23, between the nanosheets 23 and 24, and between the nanosheets 24 and the dummy nanosheets 34, respectively.

The nanosheets 21 to 24 constitute the channel portions of the transistors P1, P2, N1, and N2, respectively. The pads 41 and 42 constitute the nodes of the transistor P1, the pads 42 and 43 constitute the nodes of the transistor P2, the pads 44 and 45 constitute the nodes of the transistor N1, and the pads 45 and 46 constitute the nodes of the transistor N2.

The gate interconnects 51 and 52 and the dummy gate interconnects 55 and 56 extending in the Y and Z directions are formed in the standard cell C1. The dummy gate interconnects 55 and 56 are placed along both ends of the standard cell C1 in the X direction. The dummy gate interconnect 55, the gate interconnects 51 and 52, and the dummy gate interconnects 56 are arranged at an equal pitch in the X direction. The gate interconnect 51 is to be the gates of the transistors P1 and N1, and the gate interconnect 52 is to be the gates of the transistors P2 and N2.

That is, the transistor P1 is constituted by the nanosheets 21, the pads 41 and 42, and the gate interconnect 51. The transistor P2 is constituted by the nanosheets 22, the pads 42 and 43, and the gate interconnect 52. The transistor N1 is constituted by the nanosheets 23, the pads 44 and 45, and the gate interconnect 51. The transistor N2 is constituted by the nanosheets 24, the pads 45 and 46, and the gate interconnect 52.

As shown in FIG. 2, the nanosheets 22 and 24 are each composed of two sheet-shaped semiconductor layers (nanosheets). The two nanosheets of each of the nanosheets 22 and 24 are placed to overlap each other as viewed in plan and formed away from each other in the Z direction. Although illustration is omitted, the nanosheets 21 and 23 and the dummy nanosheets 31 to 34 also have the same structure. That is, the transistors P1, P2, N1, and N2 each include two nanosheets.

As shown in FIG. 1, local interconnects 61 to 65 extending in the Y direction are formed above the pads 41 to 46. The local interconnect 61 is connected with the pad 41, the local interconnect 62 is connected with the pad 42, the local interconnect 63 is connected with the pads 43 and 46, the local interconnect 64 is connected with the pad 44, and the local interconnect 65 is connected with the pad 45.

The local interconnect 62 extends up to a position overlapping the power supply line 11 as viewed in plan and is connected with the power supply line 11 through a contact 71. The local interconnect 64 extends up to a position overlapping the power supply line 12 as viewed in plan and is connected with the power supply line 12 through a contact 72.

Interconnects 81 to 83 extending in the X direction are formed in a first metal interconnect layer located above the local interconnects 61 to 65. The interconnect 81 is connected with the local interconnect 61 through a contact 91 and also connected with the local interconnect 63 through a contact 92. The interconnect 82 is connected with the gate interconnect 52 through a contact 93, and the interconnect 83 is connected with the gate interconnect 51 through a contact 94. The interconnects 81 to 83 correspond to the output Y and the inputs A and B in FIG. 3, respectively.

As described above, the nanosheets 21 to 24 function as the channel portions of the transistors P1, P2, N1, and N2, respectively. As for the dummy nanosheets 31 to 34, while they are connected with the pads 41, 43, 44, and 46, respectively, at one end, they are not connected with any pads at the other end. The dummy nanosheets 31 to 34 therefore do not function as channel portions of transistors.

The pad 42 is formed between the nanosheets 21 and 22, and the pad 45 is formed between the nanosheets 23 and 24. On the other hand, the pad 41 is formed between the dummy nanosheets 31 and the nanosheets 21, the pad 43 is formed between the nanosheets 22 and the dummy nanosheets 32, the pad 44 is formed between the dummy nanosheets 33 and the nanosheets 23, and the pad 46 is formed between the nanosheets 24 and the dummy nanosheets 34. That is, while the pads 42 and 45 are each formed between nanosheets that function as channel portions, the pads 41, 43, 44, and 46 are each formed between nanosheets that function as a channel portion and dummy nanosheets that do not function as a channel portion. Therefore, the standard cell C1 include pads each formed between nanosheets that function as channel portions and pads each formed between nanosheets that function as a channel portion and dummy nanosheets that do not function as a channel portion.

Note that, as described above, the standard cell C1b is also configured similarly to the standard cell C1a. That is, the transistor P3 is constituted by the nanosheets 25, the pads 47 and 48, and the gate interconnect 53. The transistor N3 is constituted by the nanosheets 26, the pads 49 and 50, and the gate interconnect 53. The pad 47 is formed between the nanosheets 25 that function as the channel portion of the transistor P3 and the dummy nanosheets 35 that do not function as a channel portion. The pad 49 is formed between the nanosheets 26 that function as the channel portion of the transistor N3 and the dummy nanosheets 36 that do not function as a channel portion.

(Configuration of Filler Cell CF)

As shown in FIG. 1, the filler cell CF is placed between the standard cells C1a and C1b.

The dummy gate interconnects 56 and 57 are formed along both ends of the filler cell CF in the X direction. The filler cell CF shares the dummy gate interconnect 56 with the standard cell C1a, and shares the dummy gate interconnect 57 with the standard cell C1b. Note however that the filler cell CF includes neither the dummy nanosheets 32 and 34 of the standard cell C1a nor the dummy nanosheets 35 and 36 of the standard cell C1b.

Local interconnects 66 and 67 extending in the Y direction are formed in the center portion of the filler cell CF in the X direction. The local interconnects 66 and 67 are formed in the same layer as the local interconnects 61 to 65.

(Method of Manufacturing Semiconductor Integrated Circuit Device of First Embodiment)

A method of manufacturing a semiconductor integrated circuit device will be described with reference to FIGS. 4A-4B to 7A-7B. FIGS. 4A-4B to 7A-7B show a cross section taken along line X1-X1' in FIG. 1.

First, as shown in FIG. 4A, a multilayer semiconductor 200 is formed on a semiconductor substrate 100. The multilayer semiconductor 200 is formed by alternately stacking semiconductor layers 210 and sacrifice semiconductor layers 220 on top of each other. The semiconductor layers 210 and the sacrifice semiconductor layers 220 are formed using different semiconductor materials from each other. Examples of such semiconductor materials include silicon (Si), germanium (Ge), silicon-germanium alloys (SiGe), silicon carbide (SiC), silicon-germanium carbide (SiGeC), III-V compound semiconductors, and II-VI compound semiconductors.

Silicon (Si) is herein used as the material of the semiconductor layers 210 and a silicon-germanium alloy (SiGe) is used as the material of the sacrifice semiconductor layers 220. The multilayer structure of the multilayer semiconductor 200 can be implemented by alternately stacking silicon (Si) and a silicon-germanium alloy (SiGe) by epitaxial growth on the semiconductor substrate 100. The epitaxial growth is achieved by a method such as rapid thermal chemical vapor deposition (RTCVD), low-energy plasma deposition (LEPD), ultra-high vacuum chemical vapor deposition (UHVCVD), atmospheric pressure chemical vapor deposition (APCVD), and molecular beam epitaxy (MBE).

Thereafter, as shown in FIG. 4B, the multilayer semiconductor 200 is patterned by known lithography and etching, whereby a multilayer semiconductor unit 201 is formed on the left and a multilayer semiconductor unit 202 is formed on the right, as viewed in the figure.

Figure 5A:
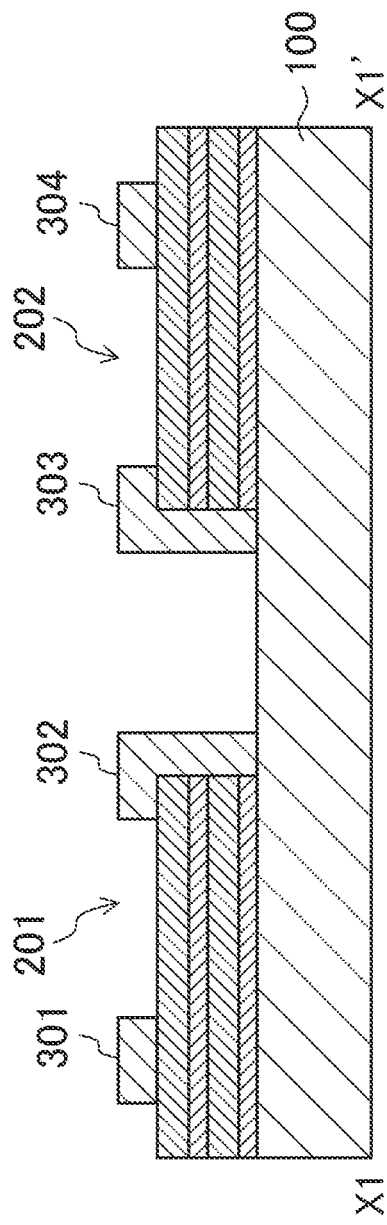
FIGS. 5A-5B are views for explaining the method of manufacturing the semiconductor integrated circuit device according to the first embodiment.

Next, as shown in FIG. 5A, sacrifice gate structures 301 to 304 are formed on the semiconductor substrate 100 and the multilayer semiconductor units 201 and 202. Specifically, the sacrifice gate structures 301 to 304 are formed at positions where the gate interconnect 52, the dummy gate interconnects 56 and 57, and the gate interconnect 53 in FIG. 1, respectively, are to be formed. Also, the sacrifice gate structures 302 and 303 are formed to cover the right side face of the multilayer semiconductor unit 201 and the left side face of the multilayer semiconductor unit 202, respectively, as viewed in the figure.

Examples of materials used for the sacrifice gate structures 301 to 304 include polysilicon, amorphous silicon, metals (e.g., tungsten, titanium, tantalous, aluminum, nickel, ruthenium, palladium, and platinum), and alloys made of a plurality of metals as materials. The sacrifice gate structures 301 to 304 may be a laminar structure formed of layers of these materials. Spacers may be formed on the surfaces of the sacrifice gate structures 301 to 304 using an insulating material such as silicon oxide and silicon nitride.

A film for the sacrifice gate structures 301 to 304 is formed by a method such as chemical vapor deposition (CVD), plasma enhanced chemical vapor deposition (PECVD), physical vapor deposition (PVD), sputtering, and atomic layer deposition (ALD). Thereafter, by known lithography and etching, the sacrifice gate structures 301 to 304 are formed at the predetermined positions.

Figure 5B:
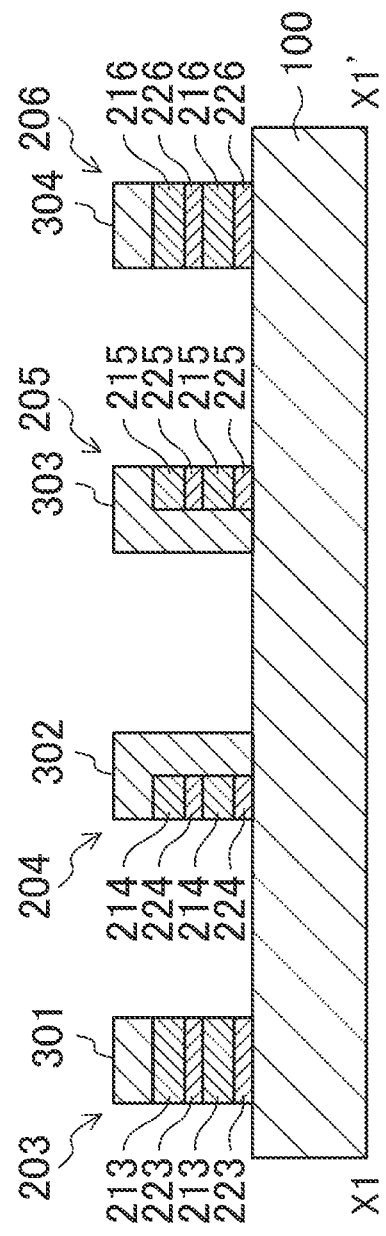

Thereafter, as shown in FIG. 5B, portions of the multilayer semiconductor units 201 and 202 other than the portions thereof covered with the sacrifice gate structures 301 to 304 are removed. Specifically, such uncovered portions of the multilayer semiconductor units 201 and 202 are removed by anisotropic etching such as reactive ion etching (RIE). As a result, multilayer semiconductor units 203 to 206 covered with the sacrifice gate structures 301 to 304, respectively, are formed on the semiconductor substrate 100. Note that, in the following description, the semiconductor layers included in the multilayer semiconductor units 203 to 206 are individually called semiconductor layers 213 to 216, respectively, and the sacrifice semiconductor layers included in the multilayer semiconductor units 203 to 206 are individually called sacrifice semiconductor layers 223 to 226, respectively.

At this point, both the left and right side faces of the multilayer semiconductor units 203 and 206 are exposed, as viewed in the figure. On the other hand, while the left side face of the multilayer semiconductor unit 204 is exposed, the right side face thereof is covered with the sacrifice gate structure 302, as viewed in figure. Also, while the left side face of the multilayer semiconductor unit 205 is covered with the sacrifice gate structure 303, the right side face thereof is exposed, as viewed in figure.

Next, as shown in FIG. 6A, an insulating film 401 as a spacer is formed on the semiconductor substrate 100. Specifically, the insulating film 401 is formed to cover the portions of the semiconductor substrate 100 that are not covered with the sacrifice gate structures 301 to 304 and the multilayer semiconductor units 203 to 206. Examples of materials for the insulating film 401 include silicon oxide and silicon nitride. The insulating film 401 can be formed by known film formation and etching methods.

As shown in FIG. 6B, pads 501 to 504 are then formed. Specifically, the pads 501 to 504 are formed by epitaxially growing the multilayer semiconductor units 203 to 206. The pads 501 to 504 correspond to the pads 45, 46, 49, and 50 in FIG. 1, respectively.

More specifically, the pad 501 is formed on the left side of the multilayer semiconductor unit 203 using the exposed portion (left side face) of the multilayer semiconductor unit 203 as the base, as viewed in the figure. The pad 502 is formed between the multilayer semiconductor units 203 and 204 using the exposed portion (right side face) of the multilayer semiconductor unit 203 and the exposed portion (left side face) of the multilayer semiconductor unit 204 as the bases, as viewed in the figure. The pad 503 is formed between the multilayer semiconductor units 205 and 206 using the exposed portion (right side face) of the multilayer semiconductor unit 205 and the exposed portion (left side face) of the multilayer semiconductor unit 206 as the bases, as viewed in the figure. The pad 504 is formed on the right side of the multilayer semiconductor unit 206 using the exposed portion (right side face) of the multilayer semiconductor unit 206 as the base, as viewed in the figure.

No pad is formed between the sacrifice gate structures 302 and 303 because the right side face of the multilayer semiconductor unit 204 and the left side face of the multilayer semiconductor unit 205, as viewed in the figure, are covered with the sacrifice gate structures 302 and 303, respectively.

An impurity-doped semiconductor material is used for the epitaxial growth performed for formation of the pads 501 to 504. Silicon, for example, is used as the semiconductor material. As impurities (semiconductors) doped in the semiconductor material, boron, aluminum, gallium, and indium, for example, are used for p-type semiconductors, and antimony, arsenic, and phosphorus, for example, are used for n-type semiconductors.

An insulating film 402 is then formed on the pads 501 to 504. Also, an insulating film 403 is formed between the sacrifice gate structures 302 and 303. Examples of the insulating films 402 and 403 include silicon dioxide and silicate glass. The insulating films 402 and 403 are formed by a method such as chemical vapor deposition and plasma enhanced chemical vapor deposition.

Next, as shown in FIG. 7A, the sacrifice gate structures 301 to 304 and the sacrifice semiconductor layers 223 to 226 are removed. Specifically, the sacrifice gate structures 301 to 304 are removed by known etching. The sacrifice semiconductor layers 223 to 226 are selectively removed (etched) from the multilayer semiconductor units 203 to 206, respectively, thereby leaving the semiconductor layers 213 to 216 above the semiconductor substrate 100. The semiconductor layers 213 to 216 correspond to the nanosheets 24, the dummy nanosheets 34 and 36, and the nanosheets 26, respectively.

Thereafter, as shown in FIG. 7B, gate oxide films 601 to 604 and gate interconnects 701 to 704 are formed in the portions where the sacrifice gate structures 301 to 304 and the sacrifice semiconductor layers 223 to 226 were removed.

Specifically, the gate oxide film 601 is formed to cover the side faces of the insulating film 402, the right side face of the pad 501, the left side face of the pad 502, the surfaces of the semiconductor layers 213 (the top and bottom faces of the semiconductor layers 213 in FIG. 7B), and the top face of the semiconductor substrate 100, as viewed in the figure. The gate oxide film 602 is formed to cover the side face of the insulating film 402, the right side face of the pad 502, the left side face of the insulating film 403, the surfaces of the semiconductor layers 214 (the top, bottom, and right side faces of the semiconductor layers 214 in FIG. 7B), and the top face of the semiconductor substrate 100, as viewed in the figure. The gate oxide film 603 is formed to cover the side face of the insulating film 402, the right side face of the insulating film 403, the left side face of the pad 503, the surfaces of the semiconductor layers 215 (the top, bottom, and left side faces of the semiconductor layers 215 in FIG. 7B), and the top face of the semiconductor substrate 100, as viewed in the figure. The gate oxide film 604 is formed to cover the side faces of the insulating film 402, the right side face of the pad 503, the left side face of the pad 504, the surfaces of the semiconductor layers 216 (the top and bottom faces of the semiconductor layers 216 in FIG. 7B), and the top face of the semiconductor substrate 100, as viewed in the figure.

The gate oxide films 601 to 604 are silicon oxide films, silicon nitride oxide films, or other high-K films (formed using a material higher in dielectric constant than silicon oxide), for example. The gate oxide films 601 to 604 are formed by a method such as chemical vapor deposition, plasma enhanced chemical vapor deposition, physical vapor deposition, sputtering, and atomic layer deposition, for example.

The gate interconnects 701 to 704 are then formed on the semiconductor substrate 100. Specifically, the gate interconnect 701 is formed between the pads 501 and 502, the gate interconnect 702 is formed between the pad 502 and the insulating film 403, the gate interconnect 703 is formed between the insulating film 403 and the pad 503, and the gate interconnect 704 is formed between the pads 503 and 504. The gate interconnects 701 to 704 correspond to the gate interconnect 52, the dummy gate interconnects 56 and 57, and the gate interconnect 53, respectively.

The gate interconnects 701 to 704 are formed of polysilicon, a metal such as tungsten, titanium, tantalum, aluminum, nickel, ruthenium, palladium, and platinum, or an alloy of such metals. The gate interconnects 701 to 704 are formed by a method such as chemical vapor deposition and plasma enhanced chemical vapor deposition, for example.

By the manufacturing method described above, the transistors N2 and N3 located near the boundaries between the adjacent standard cells C1a and C1b and the filler cell CF are formed. After the process shown in FIG. 7B, vias and interconnects such as local interconnects are formed above the transistors by known techniques to achieve connections between the transistors.

With the above configuration, the standard cells C1a and C1b are arranged side by side in the X direction. The standard cell C1a includes: the gate interconnect 52; the dummy gate interconnect 56 formed to be adjacent to the gate interconnect 52 on the right side of the gate interconnect 52 in the figure in the X direction (on the side closer to the standard cell C1b); the pad 46 provided between the gate interconnect 52 and the dummy gate interconnect 56; the nanosheets 24 formed to overlap the gate interconnect 52 as viewed in plan and connected with the pad 46; and the dummy nanosheets 34 formed to overlap the dummy gate interconnect 56 as viewed in plan and connected with the pad 46. The standard cell C1b includes: the gate interconnect 53; the dummy gate interconnect 57 formed to be adjacent to the gate interconnect 53 on the left side of the gate interconnect 53 in the figure in the X direction (on the side closer to the standard cell C1a) and also formed to be adjacent to the dummy gate interconnect 56; and the pad 49 provided between the dummy gate interconnect 57 and the gate interconnect 53.

In the right end portion of the standard cell C1a in the figure, the pad 46 is formed between the nanosheets 24 that function as a channel portion and the dummy nanosheets 34 that do not function as a channel portion. The pad 46 is formed by epitaxially growing the multilayer semiconductor units that are to be the nanosheets 24 and the dummy nanosheets 34. On the other hand, a pad formed between nanosheets functioning as channel portions (e.g., the pad 45) is formed by epitaxially growing multilayer semiconductor units formed on both sides in the X direction. That is, a pad formed in an end portion (the right end portion) of the standard cell C1 in the X direction is grown similarly to a pad formed between nanosheets functioning as channel portions. With this, variations in shape between these pads are controlled. Therefore, since variations in the manufacturing precision of transistors and variations in the performance of transistors can be controlled, it is possible to achieve improvement in the reliability and yield of the semiconductor integrated circuit device.

The standard cell C1b also includes the nanosheets 26 formed to overlap the gate interconnect 53 as viewed in plan and connected with the pad 49 and the dummy nanosheets 36 formed to overlap the dummy gate interconnect 57 as viewed in plan and connected with the pad 49.

In the left end portion of the standard cell C1b in the figure, the pad 49 is formed between the nanosheets 26 that function as a channel portion and the dummy nanosheets 36 that do not function as a channel portion. The pad 49 is formed by epitaxially growing the multilayer semiconductor units that are to be the nanosheets 26 and the dummy nanosheets 36. On the other hand, a pad formed between nanosheets functioning as channel portions (e.g., the pad 50) is formed by epitaxially growing multilayer semiconductor units formed on both sides in the X direction. That is, a pad formed in an end portion (the left end portion) of the standard cell C1 in the X direction is grown similarly to a pad formed between nanosheets functioning as channel portions. With this, variations in shape between these pads are controlled. Therefore, since variations in the manufacturing precision of transistors and variations in the performance of transistors can be controlled, it is possible to achieve improvement in the reliability and yield of the semiconductor integrated circuit device.

Note that, in the filler cell CF, formation of the local interconnects 66 and 67 may be partly or entirely omitted.

Figure 8:
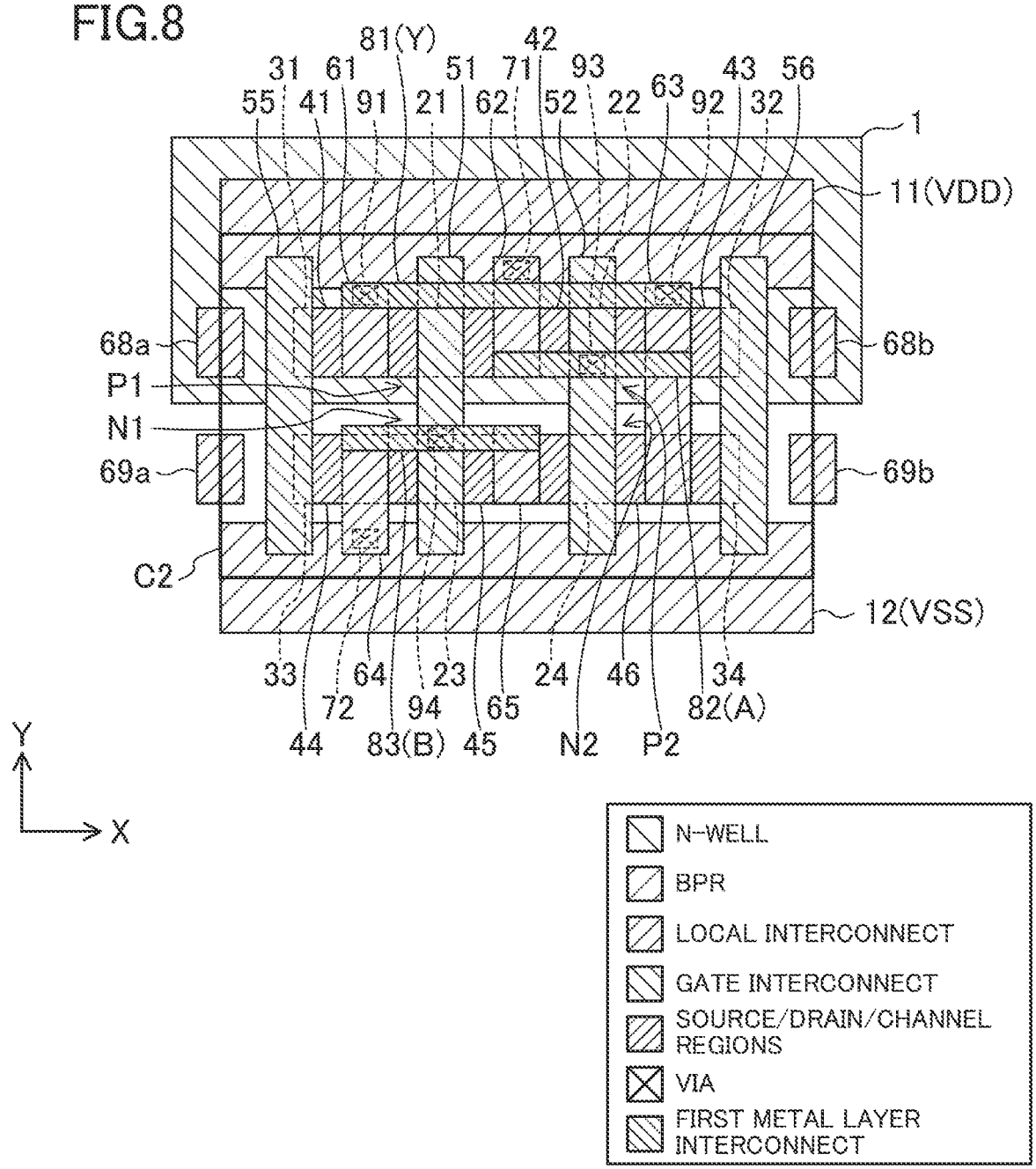
FIG. 8 is a plan view showing another example of the layout structure of a standard cell according to the first embodiment.

FIG. 8 is a plan view showing another example of the layout structure of a standard cell according to the first embodiment. Specifically, in comparison with the standard cell C1, a standard cell C2 includes local interconnects 68a and 69a extending in the Y direction along the left end in the figure and local interconnects 68b and 69b extending in the Y direction along the right end in the figure. The local interconnects 68a, 68b, 69a, and 69b are formed in the same layer as the local interconnects 61 to 65.

A layout structure similar to that of the semiconductor integrated circuit device of FIG. 1 is formed by placing another standard cell C2 adjacently to the standard cell C2 of FIG. 8 in the X direction. Specifically, the local interconnects 68b and 69b of the standard cell C2 placed on the left are shared by the standard cell C2 placed on the right as the local interconnects 68a and 69a. By this, similar effects can be obtained.

Second Embodiment

Figure 9:
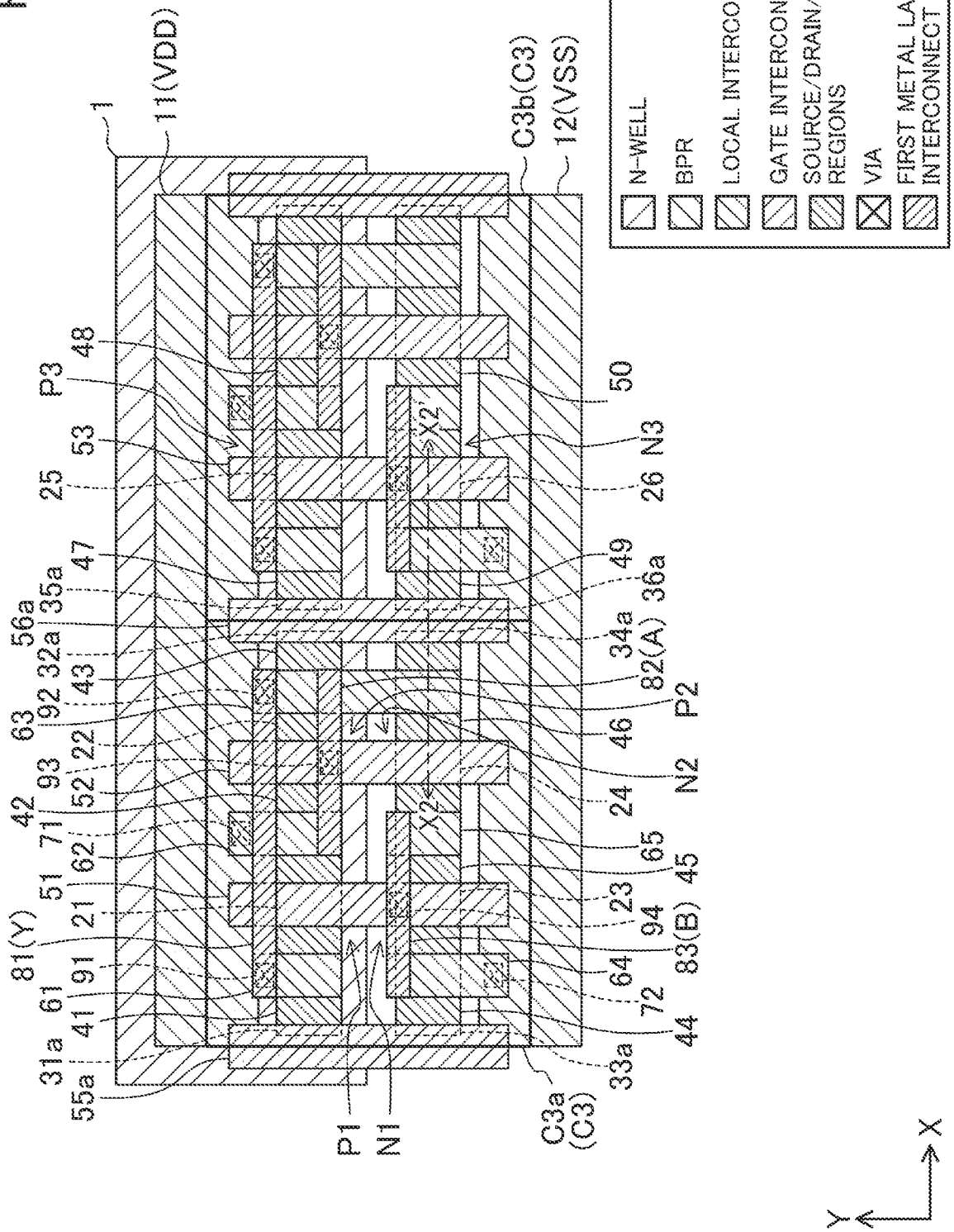
FIG. 9 is a plan view showing an example of the layout structure of a semiconductor integrated circuit device according to the second embodiment.

FIG. 9 is a plan view showing an example of the layout structure of a semiconductor integrated circuit device according to the second embodiment. In FIG. 9, two standard cells C3 are placed adjacently in the X direction. Like the standard cells C1, the standard cells C3 each constitute a 2-input NAND circuit. Note that the standard cell C3 on the left in the figure is called a standard cell C3a and the standard cell C3 on the right in the figure a standard cell C3b in some cases. Note also that, for the standard cell C3b, nanosheets 25 and 26, dummy nanosheets 35a and 36a, pads 47 to 50, a gate interconnect 53, a dummy gate interconnect 56a, and transistors P3 and N3 respectively correspond to nanosheets 21 and 23, dummy nanosheets 31a and 33a, pads 41, 42, 44 and 45, a gate interconnect 51, a dummy gate interconnect 55a, and transistors P1 and N1 of the standard cell C3 (C3a).

Specifically, the standard cell C3a shares the dummy gate interconnect 56a with the standard cell C3b. Also, although illustration is omitted, the standard cell C3a shares the dummy gate interconnect 55a with a standard cell placed on the left of the standard cell C3a in the figure.

The standard cell C3a has dummy nanosheets 32a and 34a formed in the right end portion thereof in the figure. The dummy nanosheets 32a and 34a are connected with pads 43 and 46, respectively. The dummy nanosheets 32a and 34a extend from the left end of the dummy gate interconnect 56a rightward as viewed in the figure, and overlap the dummy gate interconnect 56a as viewed in plan.

The standard cell C3b has the dummy nanosheets 35a and 36a formed in the left end portion thereof in the figure. The dummy nanosheets 35a and 36a are connected with the pads 47 and 49, respectively. The dummy nanosheets 35a and 36a extend from the right end of the dummy gate interconnect 56a leftward as viewed in the figure, and overlap the dummy gate interconnect 56a as viewed in plan.

The dummy nanosheets 32a and 35a are formed away from each other in the X direction to avoid electrical connection to each other. Also, the dummy nanosheets 34a and 36a are formed away from each other in the X direction to avoid electrical connection to each other.

Also, the standard cell C3a has the dummy nanosheets 31a and 33a formed in the left end portion thereof in the figure. The dummy nanosheets 31a and 33a are connected with the pads 41 and 44, respectively. The dummy nanosheets 31a and 33a extend from the right end of the dummy gate interconnect 55a leftward as viewed in the figure, and overlap the dummy gate interconnect 55a as viewed in plan. Although illustration is omitted, the dummy nanosheets 31a and 33a are each formed to avoid electrical connection to dummy nanosheets placed to overlap the dummy gate interconnect 55a in the standard cell placed on the left of the standard cell C3a in the figure.

(Method of Manufacturing Semiconductor Integrated Circuit Device of Second Embodiment)

A method of manufacturing a semiconductor integrated circuit device will be described with reference to FIGS. 10A-10B to 13A-13B. FIGS. 10A-10B to 13A-13B show a cross section taken along line X2-X2' in FIG. 9.

First, as shown in FIG. 10A, a multilayer semiconductor 230 is formed on a semiconductor substrate 100. The multilayer semiconductor 230 is formed by alternately stacking semiconductor layers 240 and sacrifice semiconductor layers 250 on top of each other. The semiconductor layers 240 and the sacrifice semiconductor layers 250 are formed using different semiconductor materials from each other. Specifically, materials similar to those used for the semiconductor layers 210 and the sacrifice semiconductor layers 220 are used for the semiconductor layers 240 and the sacrifice semiconductor layers 250, respectively. The multilayer semiconductor 230 is formed on the semiconductor substrate 100 by a method similar to that described with reference to FIG. 4A.

Although illustration is omitted, after the process shown in FIG. 10A, the multilayer semiconductor 230 is patterned by known lithography and etching.

Thereafter, as shown in FIG. 10B, sacrifice gate structures 311 to 313 are formed on the multilayer semiconductor 230. Specifically, the sacrifice gate structures 311 to 313 are formed at positions where the gate interconnect 52, the dummy gate interconnect 56a, and the gate interconnect 53 in FIG. 9, respectively, are to be formed. A material similar to that for the sacrifice gate structures 301 to 304 is used for the sacrifice gate structures 311 to 313. Also, the sacrifice gate structures 311 to 313 are formed at the predetermined positions on the multilayer semiconductor 230 by a method similar to that described with reference to FIG. 5A.

Figure 11A:
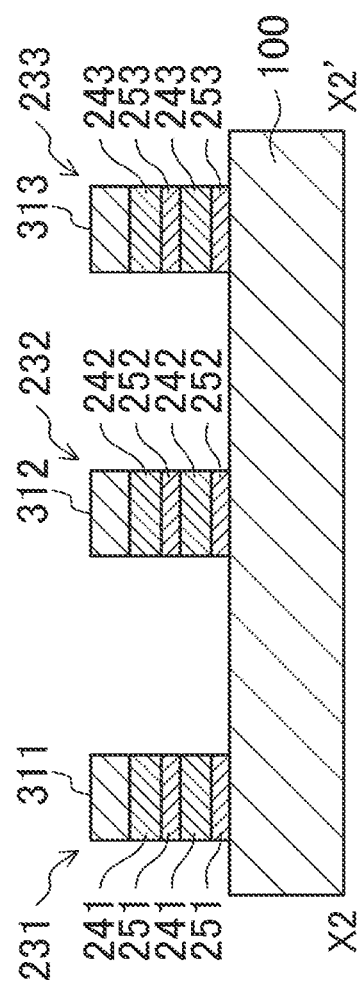
FIGS. 11A-11B are views for explaining the method of manufacturing the semiconductor integrated circuit device according to the second embodiment.

Next, as shown in FIG. 11A, portions of the multilayer semiconductor 230 other than the portions thereof covered with the sacrifice gate structures 311 to 313 are removed. In FIG. 11A, the multilayer semiconductor 230 is partially removed by a method similar to that described with reference to FIG. 5B. As a result, multilayer semiconductor units 231 to 233 covered with the sacrifice gate structures 311 to 313, respectively, are formed on the semiconductor substrate 100.

At this point, both the left and right side faces of the multilayer semiconductor units 231 to 233 in the figure are exposed. Note that the semiconductor layers in the multilayer semiconductor units 231 to 233 are individually called semiconductor layers 241 to 243, respectively, and the sacrifice semiconductor layers in the multilayer semiconductor units 231 to 233 are individually called sacrifice semiconductor layers 251 to 253, respectively.

Figure 11B:
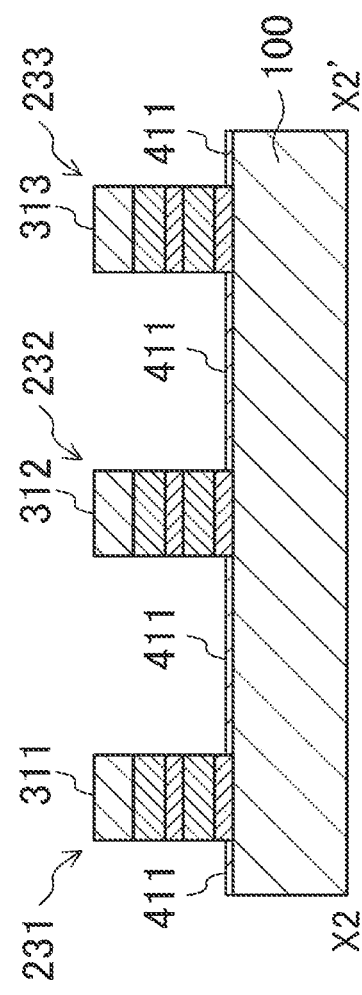

Thereafter, as shown in FIG. 11B, an insulating film 411 is formed on the semiconductor substrate 100 as a spacer. Specifically, the insulating film 411 is formed to cover the portions of the semiconductor substrate 100 that are not covered with the sacrifice gate structures 311 to 313 and the multilayer semiconductor units 231 to 233. The insulating film 411 is formed of the same material as the insulating film 401. Also, in FIG. 11B, the insulating film 411 is formed by a method similar to that described with reference to FIG. 6A.

Next, as shown in FIG. 12A, pads 511 to 514 are formed. Specifically, the pads 511 to 514 are formed by epitaxially growing the multilayer semiconductor units 231 to 233. In FIG. 12A, the epitaxial growth is performed using materials similar to those described with reference to FIG. 6B. The pads 511 to 514 correspond to the pads 45, 46, 49, and 50 in FIG. 9, respectively.

More specifically, the pad 511 is formed on the left side of the multilayer semiconductor unit 231 using the exposed portion (left side face) of the multilayer semiconductor unit 231 as the base, as viewed in the figure. The pad 512 is formed between the multilayer semiconductor units 231 and 232 using the exposed portion (right side face) of the multilayer semiconductor unit 231 and the exposed portion (left side face) of the multilayer semiconductor unit 232 as the bases, as viewed in the figure. The pad 513 is formed between the multilayer semiconductor units 232 and 233 using the exposed portion (right side face) of the multilayer semiconductor unit 232 and the exposed portion (left side face) of the multilayer semiconductor unit 233 as the bases, as viewed in the figure. The pad 514 is formed on the right side of the multilayer semiconductor unit 233 using the exposed portion (right side face) of the multilayer semiconductor unit 233 as the base, as viewed in the figure.

An insulating film 412 is then formed on the pads 511 to 514. The same material as the insulating film 402 is used for the insulating film 412. The insulating film 412 is formed by the same method as that described with reference to FIG. 6B.

As shown in FIG. 12B, the sacrifice gate structures 311 to 313 and part of the multilayer semiconductor unit 232 are removed. Specifically, the sacrifice gate structures 311 to 313 are removed by known etching. Thereafter, portions of the multilayer semiconductor unit 232 other than a center portion thereof in the X direction are masked, to remove the center portion of the multilayer semiconductor unit 232 by anisotropic etching.

The removal of the center portion of the multilayer semiconductor unit 232 is performed so that both left and right end portions thereof are slightly left unetched. The portion of the multilayer semiconductor unit 232 left unetched on the left in the figure (the portion in contact with the pad 512) is herein called a multilayer semiconductor unit 234, and the portion thereof left unetched on the right in the figure (the portion in contact with the pad 513) is herein called a multilayer semiconductor unit 235. Also, the semiconductor layers in the multilayer semiconductor units 234 and 235 are individually called semiconductor layers 244 and 245, respectively, and the sacrifice semiconductor layers in the multilayer semiconductor units 234 and 235 are individually called sacrifice semiconductor layers 254 and 255, respectively.

Figure 13A:
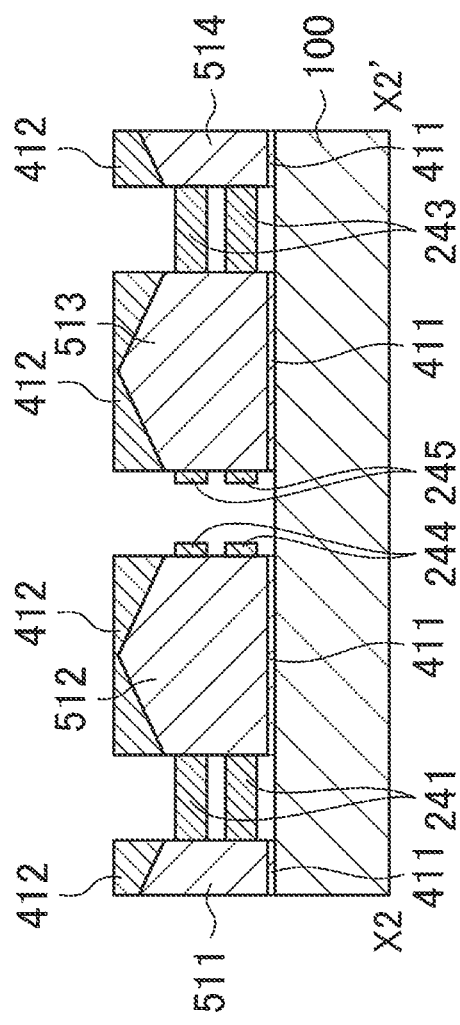
FIGS. 13A-13B are views for explaining the method of manufacturing the semiconductor integrated circuit device according to the second embodiment.

Next, as shown in FIG. 13A, the sacrifice semiconductor layers 251 and 253 to 255 are removed. Specifically, the sacrifice semiconductor layers 251 and 253 to 255 are selectively removed (etched) from the multilayer semiconductor units 231 and 233 to 235, respectively, thereby leaving the semiconductor layers 241 and 243 to 245 above the semiconductor substrate 100. The semiconductor layers 241 and 243 to 245 correspond to the nanosheets 24 and 26 and the dummy nanosheets 34a and 36a, respectively.

Figure 13B:
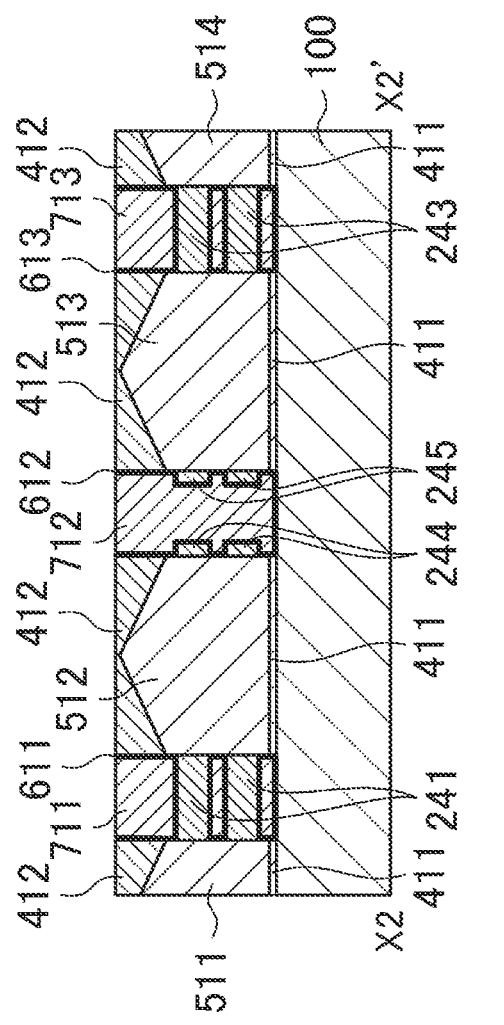

Thereafter, as shown in FIG. 13B, gate oxide films 611 to 613 and gate interconnects 711 to 713 are formed in the portions where part of the multilayer semiconductor unit 232, the sacrifice gate structures 311 to 313, and the sacrifice semiconductor layers 251 and 253 to 255 were removed.

Specifically, the gate oxide film 611 is formed to cover the side faces of the insulating film 412, the right side face of the pad 511, the left side face of the pad 512, the surfaces of the semiconductor layers 241 (the top and bottom faces of the semiconductor layers 241 in FIG. 13B), and the top face of the semiconductor substrate 100, as viewed in the figure. The gate oxide film 612 is formed to cover the side faces of the insulating film 412, the right side face of the pad 512, the left side face of the pad 513, the surfaces of the semiconductor layers 244 (the top, bottom, and right side faces of the semiconductor layers 244 in FIG. 13B), the top, bottom, and left side faces of the semiconductor layers 245, and the top face of the semiconductor substrate 100, as viewed in the figure. The gate oxide film 613 is formed to cover the side faces of the insulating film 412, the right side face of the pad 513, the left side face of the pad 514, the surfaces of the semiconductor layers 243 (the top and bottom faces of the semiconductor layers 243 in FIG. 13B), and the top face of the semiconductor substrate 100, as viewed in the figure.

A material similar to that for the gate oxide films 601 to 604 is used for the gate oxide films 611 to 613. In FIG. 13B, the gate oxide films 611 to 613 are formed by a method similar to that described with reference to FIG. 7B.

The gate interconnects 711 to 713 are then formed on the semiconductor substrate 100. Specifically, the gate interconnect 711 is formed between the pads 511 and 512, the gate interconnect 712 is formed between the pads 512 and 513, and the gate interconnect 713 is formed between the pads 513 and 514. A material similar to that for the gate interconnects 701 to 704 is used for the gate interconnects 711 to 713. In FIG. 13B, the gate interconnects 711 to 713 are formed by a method similar to that described with reference to FIG. 7B. The gate interconnects 711 to 713 correspond to the gate interconnect 52, the dummy gate interconnect 56a, and the gate interconnect 53 in FIG. 9, respectively.

By the manufacturing method described above, the transistors N2 and N3 located near the boundary between the adjacent standard cells C3a and C3b are formed. After the process shown in FIG. 13B, vias and interconnects such as local interconnects are formed above the transistors by known techniques to achieve connections between transistors.

With the above configuration, the standard cells C3a and C3b are placed adjacently in the X direction. The dummy gate interconnect 56a is formed along the boundary between the standard cells C3a and C3b. The standard cell C3a includes: the gate interconnect 52 formed to be adjacent to the dummy gate interconnect 56a in the X direction; the pad 46 provided between the dummy gate interconnect 56a and the gate interconnect 52; the nanosheets 24 formed to overlap the gate interconnect 52 as viewed in plan and connected with the pad 46; and the dummy nanosheets 34a formed to overlap the dummy gate interconnect 56a as viewed in plan and connected with the pad 46. The standard cell C3b includes: the gate interconnect 53 formed to be adjacent to the dummy gate interconnect 56a in the X direction; the pad 49 provided between the dummy gate interconnect 56a and the gate interconnect 53; the nanosheets 26 formed to overlap the gate interconnect 53 as viewed in plan and connected with the pad 49; and the dummy nanosheets 36a formed to overlap the dummy gate interconnect 56a as viewed in plan, connected with the pad 49, and formed to be away from the dummy nanosheets 34a.

In the right end portion of the standard cell C3a in the figure, the pad 46 is formed between the nanosheets 24 that function as a channel portion and the dummy nanosheets 34a that do not function as a channel portion. In the left end portion of the standard cell C3b in the figure, the pad 49 is formed between the nanosheets 26 that function as a channel portion and the dummy nanosheets 36a that do not function as a channel portion. The dummy nanosheets 34a and 36a are formed away from each other in the X direction to avoid electrical connection to each other.

The pad 46 is formed by epitaxially growing the multilayer semiconductor units that are to be the nanosheets 24 and the dummy nanosheets 34a. The pad 49 is formed by epitaxially growing the multilayer semiconductor units that are to be the nanosheets 26 and the dummy nanosheets 36a. On the other hand, a pad formed between nanosheets functioning as channel portions (e.g., the pad 45) is formed by epitaxially growing multilayer semiconductor units formed on both sides in the X direction. That is, a pad formed in an end portion of the standard cell C3 in the X direction is grown similarly to a pad formed between nanosheets functioning as channel portions. With this, variations in the shape of these pads are controlled. Therefore, since variations in the manufacturing precision of transistors and variations in the performance of transistors can be controlled, it is possible to achieve improvement in the reliability and yield of the semiconductor integrated circuit device.

Also, with the standard cells C3a and C3b being placed adjacently in the X direction, it is possible to achieve reduction in the area of the semiconductor integrated circuit device.

Note that, in FIG. 12B, the entire multilayer semiconductor unit 232 may be removed, or either one of the multilayer semiconductor units 234 and 235 may be removed.

In the embodiments described above, while the standard cells C1 to C3 each constitute a 2-input NAND circuit, the type of circuit is not limited to this, but another type of circuit may be constituted.

In the above embodiments, the number of nanosheets included in one nanosheet FET is not limited to two, but may be one or three or more.

In the above embodiments, while the cross-sectional shape of the nanosheets is rectangular, it is not limited to this. For example, the shape may be square, circular, or oval.

In the above embodiments, while each nanosheet is illustrated as entirely covered with a gate interconnect, it is not necessarily required to cover some portion of the nanosheet with the gate interconnect. For example, in FIG. 2, it is not necessarily required to cover the left side faces of the nanosheets 22 and the right side faces of the nanosheets 24, as viewed in the figure.

In the above embodiments, while each multilayer semiconductor unit is constituted by two semiconductor layers and two sacrifice semiconductor layers, the configuration is not limited to this. For example, the multilayer semiconductor unit may be constituted by two or more semiconductor layers and two or more sacrifice semiconductor layers. Also, the film thicknesses of the semiconductor layers and the sacrifice semiconductor layers may be different from each other, or may be the same.

In the method of manufacturing a semiconductor integrated circuit device in each of the above embodiments, while the insulating film 401 or 411 is formed on the semiconductor substrate 100, formation of the insulating film 401 or 411 is not necessarily required. In the latter case, epitaxial growth will occur from the semiconductor substrate 100.

According to the present disclosure, in the layout structure of a semiconductor integrated circuit device provided with standard cells using nanosheet FETs, it is possible to control variations in the performance of transistors formed in the standard cells.

What is claimed is:

1. A semiconductor integrated circuit device provided with first and second standard cells,
wherein
the first and second standard cells are arranged side by side in a first direction,
the first standard cell includes
a first gate interconnect,
a first dummy gate interconnect formed to be adjacent to the first gate interconnect on a side of the first gate interconnect closer to the second standard cell in the first direction,
a first pad provided between the first gate interconnect and the first dummy gate interconnect,
a first nanosheet formed to overlap the first gate interconnect as viewed in plan and connected with the first pad, and
a first dummy nanosheet formed to overlap the first dummy gate interconnect as viewed in plan and connected with the first pad, and
the second standard cell includes
a second gate interconnect,
a second dummy gate interconnect formed to be adjacent to the second gate interconnect on a side of the second gate interconnect closer to the first standard cell in the first direction and also formed to be adjacent to the first dummy gate interconnect, and
a second pad provided between the second gate interconnect and the second dummy gate interconnect.

2. The semiconductor integrated circuit device of claim 1, wherein
the second standard cell further includes
a second nanosheet formed to overlap the second gate interconnect as viewed in plan and connected with the second pad, and
a second dummy nanosheet formed to overlap the second dummy gate interconnect as viewed in plan and connected with the second pad.

3. The semiconductor integrated circuit device of claim 1, wherein
a filler cell is placed between the first and second standard cells.

4. The semiconductor integrated circuit device of claim 1, wherein
a local interconnect is formed between the first and second dummy gate interconnects as viewed in plan, and
the local interconnect extends in a second direction vertical to the first direction.

5. A semiconductor integrated circuit device provided with first and second standard cells,
wherein
the first and second standard cells are placed adjacently in a first direction,
a first dummy gate interconnect is formed along a cell boundary between the first and second standard cells,
the first standard cell includes
a first gate interconnect formed to be adjacent to the first dummy gate interconnect in the first direction,
a first pad provided between the first dummy gate interconnect and the first gate interconnect,
a first nanosheet formed to overlap the first gate interconnect as viewed in plan and connected with the first pad, and
a first dummy nanosheet formed to overlap the first dummy gate interconnect as viewed in plan and connected with the first pad, and
the second standard cell includes
a second gate interconnect formed to be adjacent to the first dummy gate interconnect in the first direction,
a second pad provided between the first dummy gate interconnect and the second gate interconnect,
a second nanosheet formed to overlap the second gate interconnect as viewed in plan and connected with the second pad, and
a second dummy nanosheet formed to overlap the first dummy gate interconnect as viewed in plan, connected with the second pad, and formed to be away from the first dummy nanosheet.

6. A method of manufacturing a semiconductor integrated circuit device provided with first and second standard cells, the first and second standard cells being placed adjacently in a first direction, the method comprising the steps of:

forming a multilayer semiconductor by alternately stacking two kinds of semiconductors different from each other on a semiconductor substrate;

forming, on the multilayer semiconductor, a first sacrifice gate structure at a position of a cell boundary between the first and second standard cells, forming a second sacrifice gate structure at a position where the first standard cell is to be formed, and forming a third sacrifice gate structure at a position where the second standard cell is to be formed;

forming first to third multilayer semiconductor units under the first to third sacrifice gate structures by removing portions of the multilayer semiconductor located between the first and second sacrifice gate structures and between the first and third sacrifice gate structures;

forming a first pad between the first and second multilayer semiconductor units by epitaxially growing the first and second multilayer semiconductor units, and forming a second pad between the first and third multilayer semiconductor units by epitaxially growing the first and third multilayer semiconductor units;

removing the first to third sacrifice gate structures; and removing part or all of the first multilayer semiconductor unit so as to avoid electrical connection between the first pad and the second pad through the first multilayer semiconductor unit.

* * * * *